(12) United States Patent
Liebmann et al.

(10) Patent No.: US 12,176,293 B2
(45) Date of Patent: Dec. 24, 2024

(54) INTER-TIER POWER DELIVERY NETWORK (PDN) FOR DENSE GATE-ON-GATE 3D LOGIC INTEGRATION

(71) Applicant: TOKYO ELECTRON LIMITED, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US); Brian Cline, Austin, TX (US); Xiaoqing Xu, Austin, TX (US); David Pietromonaco, San Jose, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 418 days.

(21) Appl. No.: 17/541,561

(22) Filed: Dec. 3, 2021

(65) Prior Publication Data
US 2022/0181263 A1    Jun. 9, 2022

Related U.S. Application Data

(60) Provisional application No. 63/121,605, filed on Dec. 4, 2020.

(51) Int. Cl.
*H01L 23/538* (2006.01)
*H01L 23/48* (2006.01)
*H01L 23/498* (2006.01)
*H01L 25/00* (2006.01)
*H01L 25/065* (2023.01)

(52) U.S. Cl.
CPC ........ *H01L 23/5383* (2013.01); *H01L 23/481* (2013.01); *H01L 23/49833* (2013.01); *H01L 25/0657* (2013.01); *H01L 25/50* (2013.01)

(58) Field of Classification Search
CPC ............... H01L 23/5383; H01L 23/481; H01L 23/49833; H01L 25/0657; H01L 25/50
See application file for complete search history.

(56) References Cited

U.S. PATENT DOCUMENTS

2015/0130068 A1\* 5/2015 Lin .................. H01L 27/10
257/773
2015/0333056 A1\* 11/2015 Du .................. H01L 27/0688
257/773

(Continued)

*Primary Examiner* — Benjamin Tzu-Hung Liu
(74) *Attorney, Agent, or Firm* — Oblon, McClelland, Maier & Neustadt, L.L.P.

(57) ABSTRACT

Aspects of the present disclosure provide a multi-tier semiconductor structure. For example, the multi-tier semiconductor structure can include a lower semiconductor device tier, and a lower signal wiring structure electrically connected to the lower semiconductor device tier. The multi-tier semiconductor structure can further include a primary power delivery network (PDN) structure disposed over the lower semiconductor device tier and the lower signal wiring structure and electrically connected to the lower semiconductor device tier. The multi-tier semiconductor structure can further include an upper semiconductor device tier disposed over and electrically connected the first PDN structure, and an upper signal wiring structure disposed over the primary PDN structure and electrically connected to the upper semiconductor device tier.

16 Claims, 3 Drawing Sheets

(56) References Cited

U.S. PATENT DOCUMENTS

| | | | |
|---|---|---|---|
| 2015/0348962 A1* | 12/2015 | Chao | H01L 21/768 |
| | | | 257/207 |
| 2016/0140276 A1* | 5/2016 | Sarhan | G06F 30/394 |
| | | | 716/103 |
| 2016/0322331 A1* | 11/2016 | Lim | H01L 24/05 |
| 2017/0062319 A1* | 3/2017 | Guo | H01L 21/4846 |
| 2019/0057959 A1* | 2/2019 | Or-Bach | H01L 21/76259 |
| 2019/0363079 A1* | 11/2019 | Thei | H01L 23/481 |
| 2020/0135718 A1* | 4/2020 | Liebmann | H01L 21/8221 |

* cited by examiner

INTER-TIER POWER DELIVERY NETWORK (PDN) FOR DENSE GATE-ON-GATE 3D LOGIC INTEGRATION

INCORPORATION BY REFERENCE

This present disclosure claims the benefit of U.S. Provisional Application No. 63/121,605, entitled "Inter-Tier PDN for Dense Gate-on-Gate 3D Logic Integration" filed on Dec. 4, 2020, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of integrated circuits (ICs).

SUMMARY

Aspects of the present disclosure provide a multi-tier semiconductor structure. For example, the multi-tier semiconductor structure can include a lower semiconductor device tier, and a lower signal wiring structure electrically connected to the lower semiconductor device tier. The multi-tier semiconductor structure can further include a primary power delivery network (PDN) structure disposed over the lower semiconductor device tier and the lower signal wiring structure and electrically connected to the lower semiconductor device tier. The multi-tier semiconductor structure can further include an upper semiconductor device tier disposed over and electrically connected the first PDN structure, and an upper signal wiring structure disposed over the primary PDN structure and electrically connected to the upper semiconductor device tier.

In an embodiment, the multi-tier semiconductor structure can further include a secondary PDN structure disposed between the primary PDN structure and the lower semiconductor device tier and the lower signal wiring structure and electrically connecting the primary PDN structure to the lower semiconductor device tier. For example, the secondary PDN structure can be narrower than the primary PDN structure.

In another embodiment, the multi-tier semiconductor structure can further include a through-silicon via (TSV) structure that electrically connects the lower semiconductor device tier and the lower signal wiring structure to the upper semiconductor device tier and the upper signal wiring structure. For example, the TSV structure includes a plurality of TSVs vertically stacked over one another. In an embodiment, the TSV structure can penetrate the primary PDN structure.

In some other embodiments, the multi-tier semiconductor structure can further includes an upper substrate disposed between the upper semiconductor device tier and the primary PDN structure, and an upper power rail buried in the upper substrate. For example, the upper power rail can electrically connect the primary PDN structure to the upper semiconductor device tier.

In an embodiment, the upper signal wiring structure can be disposed over the upper semiconductor device tier. In another embodiment, the lower semiconductor device tier can be disposed over the lower signal wiring structure. In some other embodiments, the lower semiconductor device tier and the upper semiconductor device tier can be symmetrical with respect to the primary PDN structure.

In an embodiment, the multi-tier semiconductor structure can further include a power distribution structure electrically connected to the primary PDN structure. For example, the power distribution structure can be disposed beyond the upper signal wiring structure and the lower signal wiring structure. As another example, the power distribution structure can be disposed within a boundary region of the multi-tier semiconductor structure.

In an embodiment, the upper semiconductor device tier can include multiple upper semiconductor devices that are vertically stacked over one another. For example, the upper semiconductor devices can include gate-all-around semiconductor devices that are vertically stacked over one another.

In an embodiment, the upper signal wiring structure can include multiple wiring levels. In another embodiment, the lower signal wiring structure can include multiple wiring levels.

In another embodiment, the primary PDN structure can be sized sufficiently to shield the lower semiconductor device tier when executing annealing when forming the upper semiconductor device tier.

In various embodiments, the multi-tier semiconductor structure can further include another lower semiconductor device tier disposed on and electrically connected to the upper signal wiring structure, another primary PDN structure disposed over the another lower semiconductor device tier and electrically connected to the another lower semiconductor device tier, another upper semiconductor device tier disposed over and electrically connected to the another primary PDN structure, and another upper signal wiring structure disposed over the another primary PDN structure and electrically connected to the another upper semiconductor device tier.

Aspects of the present disclosure also provide a method for fabricating a multi-tier semiconductor structure. For example, the method can include providing a lower semiconductor device tier, and electrically connecting a lower signal wiring structure to the lower semiconductor device tier. The method can further include disposing a primary PDN structure over the lower semiconductor device tier and the lower signal wiring structure, and electrically connecting the primary PDN structure to the lower semiconductor device tier. The method can further include disposing an upper semiconductor device tier and an upper signal wiring structure over the primary PDN structure, and electrically connecting the upper semiconductor device tier to the upper signal wiring structure. The method can further include electrically connecting the primary PDN structure to the upper semiconductor device tier.

In an embodiment, the multi-tier semiconductor structure can be fabricated by sequential 3D integration. For example, the primary PDN structure can be sized sufficiently to shield the lower semiconductor device tier when executing annealing when forming the upper semiconductor device tier.

In an embodiment, the method can further include forming a TSV structure that electrically connects the lower semiconductor device tier and the lower signal wiring structure to the upper semiconductor device tier and the upper signal wiring structure.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of the present disclosure that are proposed as examples will be described in detail with reference to the following figures, wherein like numerals reference like elements, and wherein.

DETAILED DESCRIPTION

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

Techniques herein include a novel construct and the associated process integration solution that enables efficient and compact integration of transistors into dense 3D logic functions. 3D integration, i.e., the vertical stacking of multiple semiconductor device tiers of logic and memory, aims to overcome scaling limitations experienced in conventional two dimensional VLSI by offering the integrated circuit design, e.g., place and route tool, an additional degree of freedom in reducing wire-length across critical paths. 3D integration (3Di) techniques herein are particularly applicable to a 3D fabrication formation known as gate-on-gate (GoG) 3Di. In GoG 3Di two or more semiconductor device tiers of silicon are sequentially fabricated, e.g., deposited, grown or bonded, onto the primary substrate. This bonding of silicon or wafers enables the vertical stacking of logic and memory cells with dense connectivity at a resolution limited only by lithography, instead of wafer or chip bonding alignment tolerances.

One aspect of dense GoG 3Di that is challenging is the power-delivery across multiple functional semiconductor device tiers. Increasing the volumetric density of transistors without providing for an adequate power delivery network (PDN) would prove counterproductive. Techniques herein provide a micro-architecture that integrates a multi-tier PDN while also providing an efficient heat sink to prevent overheating of the dense 3Di chip during operation as well as a heat shield that can protect existing lower semiconductor devices of a lower semiconductor device tier from damage during high temperature processing of upper semiconductor devices of an upper semiconductor device tier.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

Figure 1:
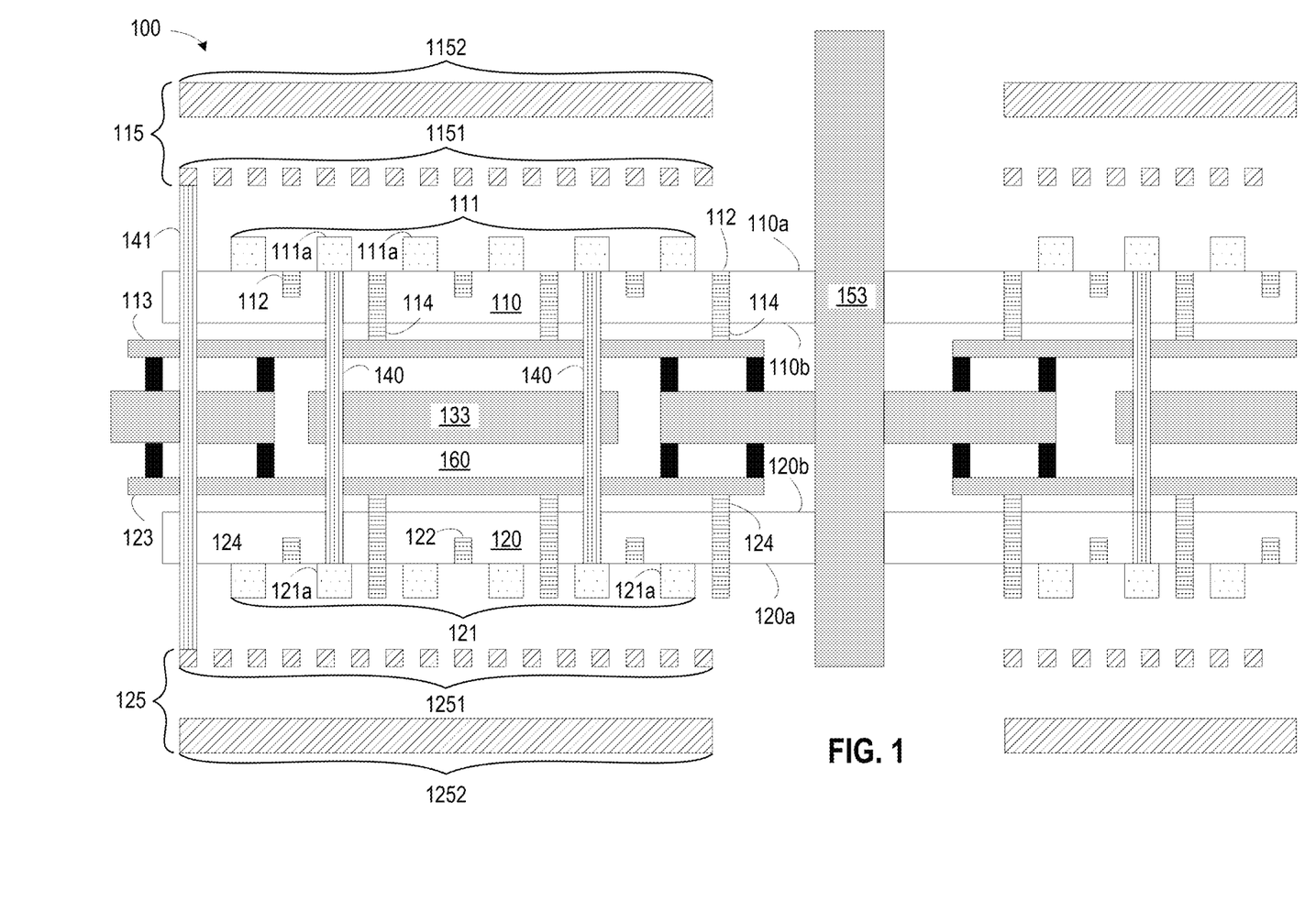
FIG. 1 shows a simplified cross-sectional view of a multi-tier semiconductor structure in accordance with some embodiments of the present disclosure.
Figure 2:
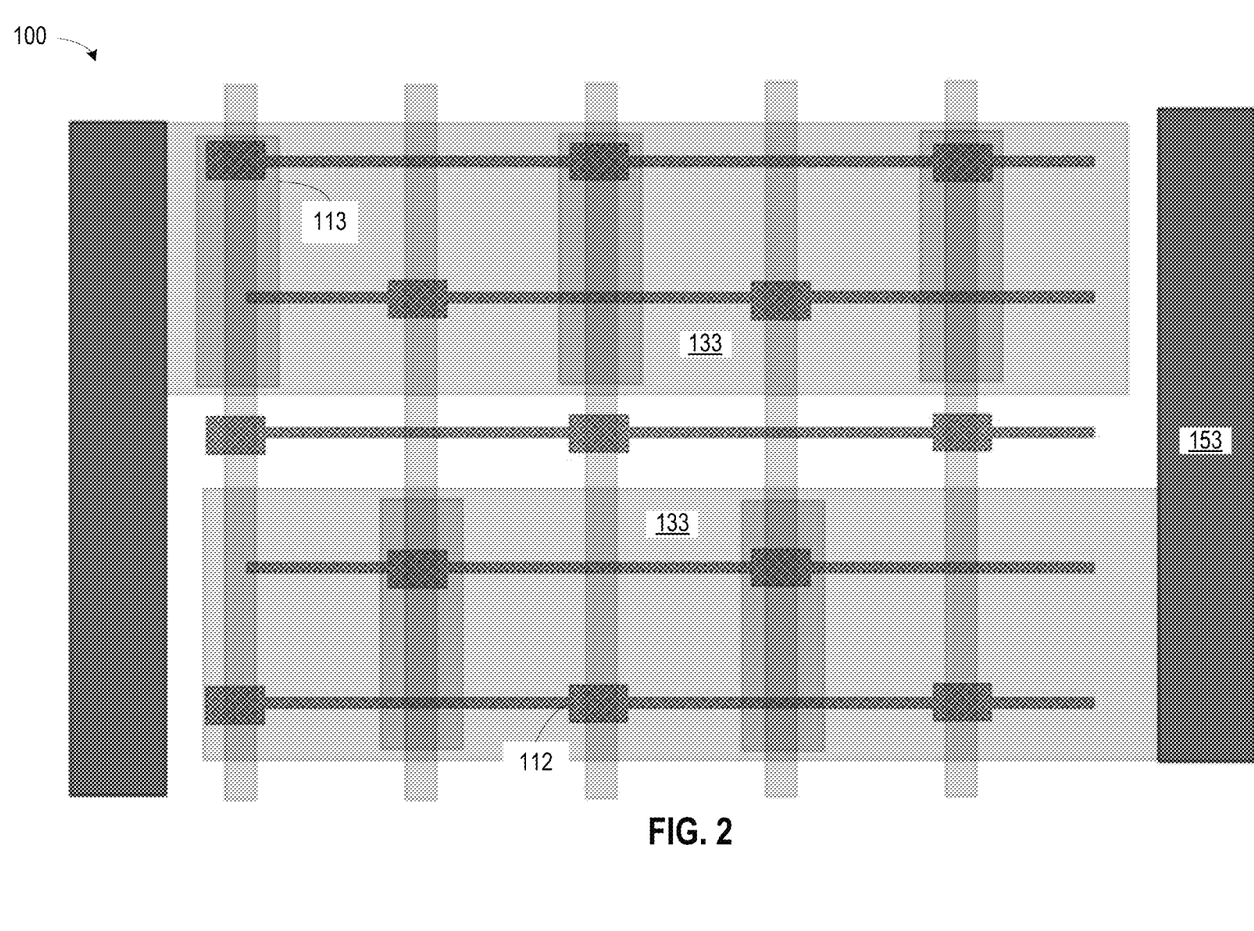
FIG. 2 shows a top view of the semiconductor structure in accordance with some embodiments of the present disclosure.

FIG. 1 shows a simplified cross-sectional view of an exemplary multi-tier semiconductor structure 100, which illustrates an exemplary dense 3Di micro-architecture using an inter-tier PDN structure that dedicates an inter-tier gap primarily to power distribution, in accordance with some embodiments of the present disclosure. FIG. 2 shows a top view of the semiconductor structure 100. A first substrate (or a wafer) 110, e.g., a silicon or SiGe substrate, can be provided. A first (or upper) semiconductor device tier 111 can be disposed on the first substrate 110. For example, the first semiconductor device tier 111 can be disposed on a front side 110a of the first substrate 110, as shown in FIG. 1. As another example, another first semiconductor device tier can be disposed on a back side 110b of the first substrate 110. The first semiconductor device tier 111 can include one or more first (or upper) semiconductor devices 111a, such as field effect transistors (FETs), that form a functional circuit, such as a logic circuit or a memory circuit. Further, these FETs can be n-type or p-type FETs that are arranged along the front side 110a or stacked vertically over one another along the thickness direction of the first substrate 110. In an embodiment, the first semiconductor devices 111a can include gate-all-around (GAA) semiconductor devices that are vertically stacked over one another. In another embodiment, the first semiconductor devices 111a can include FinFETs that are vertically stacked over one another.

One or more first (or upper) power rails 112 can be buried in the first substrate 110 and electrically connect the first semiconductor device tier 111 to a first power delivery network (PDN) structure 113 by way of first through-silicon vias (TSVs) (e.g., nano-scale) 114 to provide low voltage (Vss) and high voltage (VDD) power delivery, for example, from the first PDN structure 113 to the first semiconductor device tier 111. In an embodiment, the first PDN structure 113 can be disposed on the back side 110b of the first substrate 110. In another embodiment, the first PDN structure 113 can include a PDN wire or plate.

A first (or upper) signal wiring structure (or a first wiring tier) 115 can be disposed over the first semiconductor device tier 111 and used to electrically connect the first semiconductor device tier 111 to, for example, another semiconductor device tier (not shown) disposed over the first signal wiring structure 115. The first signal wiring structure 115 can include one or more wiring layers (or wiring levels), with each wiring layer including one or more wiring tracks that extend in a direction along the front side 110a of the first substrate 110. Generally, wiring tracks in one wiring layer will run in a direction perpendicular to the direction of wiring tracks in an adjacent wiring layer. For example, the first signal wiring structure 115 can include two wiring layers 1151 and 1152, and the wiring layer 1151 can include 16 wiring tracks that extend in a direction (e.g., perpendicular to the plane of the drawing page) perpendicular to the direction of wiring tracks in the wiring layer 1152 along the front side 110a of the first substrate 110. In a 2D routing embodiment, the first signal wiring structure 115 can be disposed between two semiconductor devices and used to electrically connect these two semiconductor devices.

A third PDN structure (e.g., a PDN wire or plate) 133 can be disposed under the first PDN structure 113. The third PDN structure 133 can be very wide in order to provide a low resistance primary power distribution. In an embodiment, the first PDN structure 113 can act as a secondary PDN structure (or a secondary power plane, a local power distribution structure), while the third PDN structure 133 can act as a primary PDN structure (or a primary power plane, a central power backbone, a global power plane) to provide one, two or more than two voltages, e.g., low voltage (Vss) and high voltage (VDD) power delivery, supplied from a power supply (not shown) through the first PDN structure 113, the first TSVs 114 and the first power rails 112 sequentially to the first semiconductor device tier 111. For example, the third PDN structure 133 can be wider than the first PDN structure 113. In an embodiment, the first PDN structure 113 can be omitted, the first power rails 112 can electrically connect the first semiconductor device tier 111 to the third PDN structure 133 by way of the first TSVs 114, and the third PDN structure 133 can thus provide low voltage (Vss) and high voltage (VDD) power delivery, for example, supplied from the power supply through the first TSVs 114 and the first power rails 112 sequentially to the first semiconductor device tier 111.

A second substrate (or a wafer) 120, e.g., a silicon or SiGe substrate, can be disposed under the third PDN structure 133. A second (or lower) semiconductor device tier 121 can be disposed on the second substrate 120. For example, the second semiconductor device tier 121 can be disposed on a front side 120a of the second substrate 120, as shown in FIG. 1. As another example, another second semiconductor device tier can be disposed on a back side 120b of the second substrate 120. The second semiconductor device tier 121 can include one or more second (or lower) semiconductor devices 121a, such as FETs, that form a functional circuit, such as a logic circuit or a memory circuit. Further, these FETs can be n-type or p-type FETs that are arranged along the front side 120a or stacked vertically over one another along the thickness direction of the second substrate 120. In an embodiment, the second semiconductor devices 121a can include GAA semiconductor devices that are vertically stacked over one another. In another embodiment, the second semiconductor devices 121a can include FinFETs that are vertically stacked over one another.

One or more second power rails 122 can be buried in the second substrate 120 and electrically connect the second semiconductor device tier 121 to a second PDN structure 123 by way of second TSVs (e.g., nano-scale) 124 to provide low voltage (Vss) and high voltage (VDD) power delivery, for example, from the second PDN structure 123 to the second semiconductor device tier 121. The second PDN structure 123 can be formed on the back side 120b of the second substrate 120.

In an embodiment, the second PDN structure 123 can act as a secondary PDN structure (or a secondary power plane, a local power distribution wire), while the third PDN structure 133 can act as a primary PDN structure (or a primary power plane, a central power backbone) to provide low voltage (Vss) and high voltage (VDD) power delivery, for example, supplied from a power supply (not shown) through the third PDN structure 133, the second TSVs 124 and the second power rails 122 sequentially to the second semiconductor device tier 121. For example, the third PDN structure 133 can be wider than the second PDN structure 113. In an embodiment, the second PDN structure 123 can be omitted, the second power rails 122 can electrically connect the second semiconductor device tier 121 to the third PDN structure 133 by way of the second TSVs 124, and the third PDN structure 133 can thus provide low voltage (Vss) and high voltage (VDD) power delivery, for example, supplied from the power supply through the second TSVs 124 and the second power rails 122 sequentially to the second semiconductor device tier 121.

In an embodiment, the upper tier (including the first semiconductor device tier 111, the first power rails 112, the first substrate 110 and the first signal wiring structure 115) and the lower tier (including the second semiconductor device tier 121, the second power rails 122, the second substrate 120 and a second signal wiring structure 125 (described below)) can be separated by an inter-tier gap 160, which is filled with the first PDN structure 113, the second PDN structure 123 and the third PDN structure 133.

A second (or lower) signal wiring structure (or a second wiring tier) 125 can be disposed under the second semiconductor device tier 121 and used to electrically connect the second semiconductor device tier 121 to, for example, another semiconductor device tier (not shown) disposed under the second signal wiring structure 125. The second signal wiring structure 125 can include one or more wiring layers (or wiring levels), with each wiring layer including one or more wiring tracks that extend in a direction along the front side 120a of the second substrate 120. Generally, wiring tracks in one wiring layer will run in a direction perpendicular to the direction of wiring tracks in an adjacent wiring layer. For example, the second signal wiring structure 125 can include two wiring layers 1251 and 1252, and the wiring layer 1251 can include 16 wiring tracks that extend in a direction (e.g., perpendicular to the plane of the drawing page) perpendicular to the direction of wiring tracks in the wiring layer 1252 along the front side 120a of the second substrate 120. In a 2D routing embodiment, the second signal wiring structure 125 can be disposed between two semiconductor devices and used to electrically connect these two semiconductor devices.

The semiconductor structure 100 can further include one or more TSV structures 140/141. The TSV structure 140/141 can electrically connect the first semiconductor device tier 111 and the first signal wiring structure 115 to the second semiconductor device tier 121 and the second signal wiring structure 125. For example, the TSV structure 140/141 can include a plurality of TSVs vertically stacked over one another. As another example, the TSV structure 140/141 can include a single TSV (or a tier-to-tier via). In an embodiment, the TSV structure 140/141 can penetrate all of the first PDN structure 113, the third PDN structure 133 and the second PDN structure 123, as shown in FIG. 1. In another embodiment, the TSV structure 140 can penetrate two, one or none of the first PDN structure 113, the third PDN structure 133 and the second PDN structure 123.

The semiconductor structure 100 can further include a power distribution structure (e.g., a power distribution TSV) 153 that is electrically connected to and feed power into the third PDN structure (i.e., the primary power plane or the central power backbone) 133. In an embodiment, the power distribution structure 153 can be perpendicular to the third PDN structure 133 and penetrate the first semiconductor device tier 111 and the second semiconductor device tier 121. In another embodiment, the power distribution structure 153 can be disposed beyond the first signal wiring structure 115 and the second signal wiring structure 125. In some other embodiments, the power distribution structure 153 can be disposed within an under-used area of the semiconductor structure 100. For example, the power distribution structure 153 can be disposed within a boundary region of the semiconductor structure 100. In an embodiment, the power distribution structure 153 can include a plurality of TSVs vertically stacked over one another. In another embodiment, the power distribution structure 153 can include a single TSV (or a tier-to-tier via).

In an embodiment, the first semiconductor device tier 111 and the second semiconductor device tier 121 can be symmetrical (e.g., being constructed in mirror symmetry) with respect to the third PDN structure 133, to allow both to connect to back-side PDNs (e.g., the first PDN structure 113, the third PDN structure 133 and the second PDN structure 123), preferably through buried power rails (e.g., the first power rails 112 and the second power rails 122).

In the example embodiment shown in FIG. 1, the semiconductor structure 100 includes one pair of semiconductor device tiers (i.e., the first semiconductor device tier 111 and the second semiconductor device tier 121). In another embodiment, the semiconductor structure 100 can include more pairs of semiconductor device tiers, and the third PDN structure 133 (and/or the first PDN structure 113 and/or the second PDN structure 123) can be disposed between any pair of semiconductor device tiers.

In an embodiment, the first semiconductor device tier 111 (and the second semiconductor device tier 121) can be fabricated in a front-end-of-line (FEOL) level, the first power rails 112 (and the second power rails 122) can be fabricated in a middle-of-line (MOL) level, and the first signal wiring structure 115 (and the second signal wiring structure 125) can be fabricated in a back-end-of-line (BEOL) level. Then, the first PDN structure 113, the second PDN structure 123 and the third PDN structure 133 can be bonded between the upper tier (including the first semiconductor device tier 111, the first substrate 110, the first power rails 112 and the first signal wiring structure 115) and the lower tier (including the second semiconductor device tier 121, the second substrate 120, the second power rails 122 and the second signal wiring structure 125). The bonding processing can include hybrid bonding, which loosely refers to any alternative to thermocompression bonding that combines metal interconnect with some other form of bonding. The hybrid bonding can include adhesive, or involve various interconnect metals such as copper (Cu), indium (In) and silver (Ag). The upper tier and the lower tier can be bonded in a wafer-to-wafer or die-to-wafer hybrid bonding manner. For example, the upper tier can include a plurality of chiplets (dies), which may be of different sizes, these dies can be transferred to a carrier wafer first, then the carrier wafer can be bonded to the lower tier, and finally the carrier wafer can be removed. As another example, the dies of the upper tier can be transferred to the lower tier individually using a pick-and-place flip-chip bonder.

In another embodiment, the semiconductor structure 100 can be fabricated by sequential 3D integration (3Di) (also referred to by some as monolithic 3Di), to achieve overlay tolerances compatible with dense inter-tier wiring. This monolithic 3Di involves sequentially fabricating multiple semiconductor device levels (e.g., the upper tier and the lower tier) one after the other on the same substrate. There is only one substrate, hence no need for aligning, thinning, bonding, or TSVs that may be used in hybrid, back-to-back or face-to-face bonding. For example, in CoolCube™, which is a sequential 3Di process pioneered by CEA-Leti (more information can be found at https://en.wikipedia.org/wiki/Threee-dimensional_intrgrated_circuit), the lower tier can be built at a thermal budget reaching 1,000° C., then an silicon-on-insulator (SoI) layer can be bonded to the top of the lower tier, and finally the upper tier can be built over the lower tier at another thermal budget less than 600° C., e.g., 500° C., which is far lower than 1,000° C. This lower thermal budget can ensure that the performance of the lower tier is not degraded while the upper tier is fabricated and the intrinsic performance of the upper tier is not reduced. A major advantage of this sequential 3Di process is the near perfect alignment of the upper tier to the existing lower tier.

As the semiconductor structure 100 includes the third PDN structure 133, which is disposed over the lower tier, the third PDN structure 133 can be sized sufficiently, in an embodiment, to shield the second semiconductor devices 121a of the second semiconductor device tier 121 (i.e., the lower tier) when executing annealing when forming the first semiconductor devices 111a of the first semiconductor device tier 111 (i.e., the upper tier). In addition to providing shielding, the third PDN structure 133 can also provide mechanical strength to the semiconductor structure 100, as the third PDN structure 133 can be very wide. The third PDN structure 133, which can be very wide, can put unusually large metal wires or plates in close proximity to the first semiconductor devices 111a and the second semiconductor devices 121a and act as a very effective heat sink that conducts heat away from the first semiconductor devices 111a and the second semiconductor devices 121a.

In an embodiment, two or more of the multi-tier semiconductor structures 100 can be stacked on one another. For example, another second signal wiring structure (e.g., the second signal wiring structure 125) can be disposed on the first signal wiring structure 115, another second semiconductor device tier (e.g., the second semiconductor device tier 121) can be disposed over and electrically connected to the another second signal wiring structure, another third PDN structure (e.g., the third PDN structure 133) can be disposed over and electrically connected to the another second semiconductor device tier, another first semiconductor device tier (e.g., the first semiconductor device tier 111) can be disposed over and electrically connected to the another third PDN structure, and another first signal wiring structure (e.g., the first signal wiring structure 115) can be disposed over and electrically connected to the anther upper semiconductor device tier, thus forming two of the multi-tier semiconductor structures 100 that are stacked on each other. In another embodiment, another first PDN structure (e.g., the first PDN structure 113) can be disposed between the another first semiconductor device tier and the another third PDN structure and electrically connected to the another third PDN structure, and/or another second PDN structure (e.g., the second PDN structure 123) can be disposed between the another second semiconductor device tier and the another third PDN structure and electrically connected to the another third PDN structure.

Figure 3:
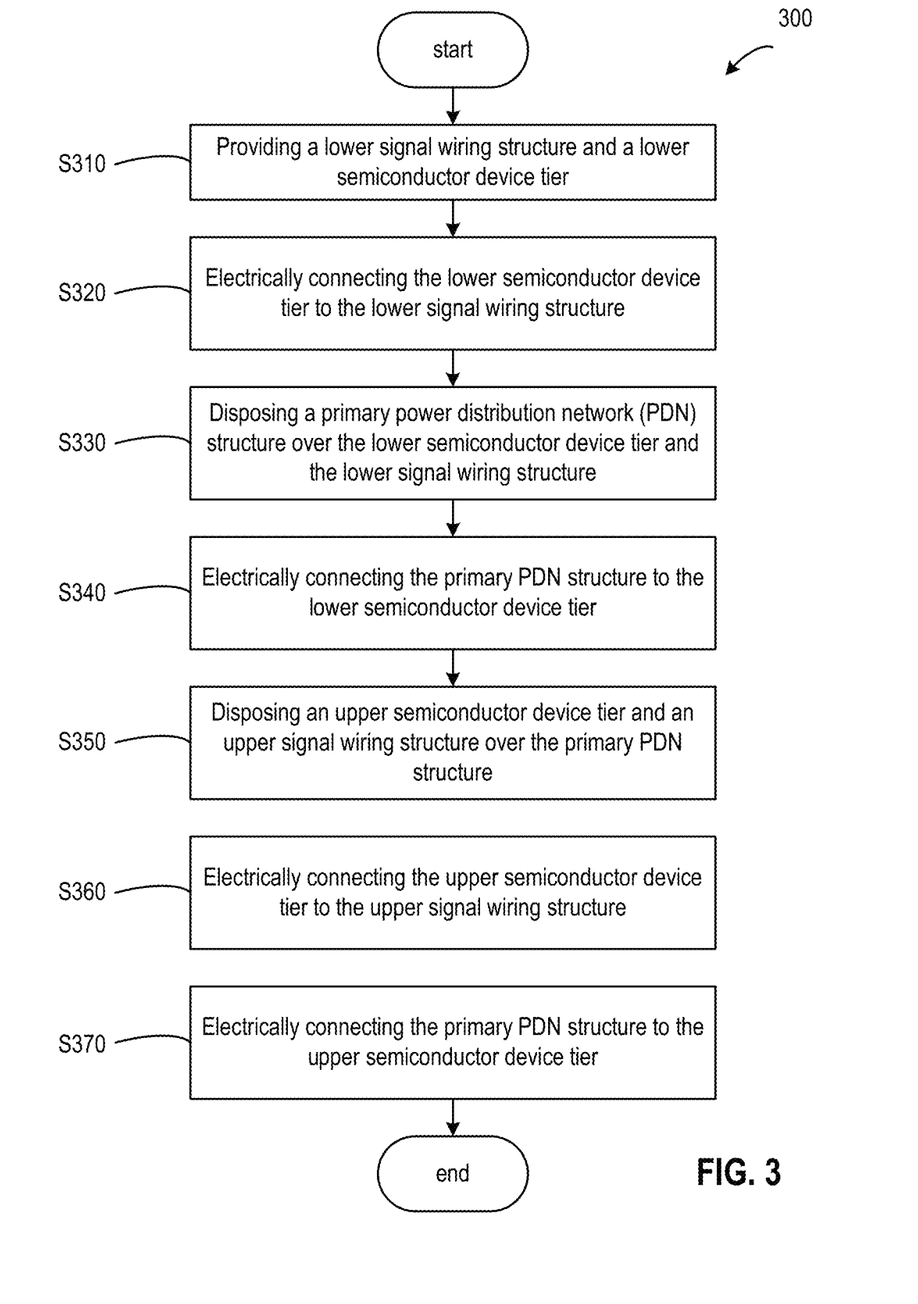
FIG. 3 is a flow chart illustrating an exemplary method for fabricating a multi-tier semiconductor structure in accordance with some embodiments of the present disclosure.

FIG. 3 is a flow chart illustrating an exemplary method 300 for fabricating a multi-tier semiconductor structure in accordance with some embodiments of the present disclosure. In an embodiment, some of the steps of the exemplary method 300 shown can be performed concurrently or in a different order than shown, can be substituted by other method steps, or can be omitted. Additional method steps can also be performed as desired. In another embodiment, the exemplary method 300 can correspond to the multi-tier semiconductor structures 100 of FIG.

At step S310, a lower signal wiring structure (or a lower wiring tier) and a lower semiconductor device tier can be provided. For example, the lower signal wiring structure 125 can be provided, and the second semiconductor device tier 121 can be provided over the lower signal wiring structure 125. In an embodiment, the lower semiconductor device tier can include lower semiconductor devices. For example, the second semiconductor device tier 121 can include the second semiconductor devices 121a.

At step S320, the lower semiconductor device tier can be electrically connected to the lower signal wiring structure. For example, the second semiconductor device tier 121 can be electrically connected to the second signal wiring structure 125. In an embodiment, the second semiconductor device tier 121 can be disposed over the second signal wiring structure 125.

At step S330, a primary PDN structure (e.g., PDN wire or plate) can be disposed over the lower semiconductor device tier and the lower signal wiring structure. For example, the third PDN structure 133 can be disposed over the second semiconductor device tier 121 and the second signal wiring structure 125.

At step S340, the primary PDN structure can be electrically connected to the first semiconductor device tier. For example, the third PDN structure 133 can be electrically connected to the second semiconductor device tier 121.

At step S350, an upper semiconductor device tier and an upper signal wiring structure (or an upper wiring tier) can be disposed over the primary PDN structure. For example, the first semiconductor device tier 111 and the first signal wiring structure 115 can be disposed over the third PDN structure 133. In an embodiment, the upper semiconductor device tier can include upper semiconductor devices. For example, the first semiconductor device tier 111 can include the first semiconductor devices 111a. In another embodiment, the upper signal wiring structure can be disposed over the upper semiconductor device tier. For example, the first signal wiring structure 115 can be disposed over the first semiconductor device tier 111.

At step S360, the upper semiconductor device tier can be electrically connected to the upper signal wiring structure. For example, the first semiconductor device tier 111 can be electrically connected to the first signal wiring structure 115.

At step S370, the primary PDN structure can be electrically connected to the upper semiconductor device tier. For example, the third PDN structure 133 can be electrically connected to the first semiconductor device tier 111.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with some embodiments of the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of the present disclosure. As such, the foregoing descriptions of embodiments of the present disclosure are not intended to be limiting. Rather, any limitations to embodiments of the present disclosure are presented in the following claims.

What is claimed is:

1. A multi-tier semiconductor structure, comprising:
   a lower semiconductor device tier;
   a lower signal wiring structure electrically connected to the lower semiconductor device tier;
   a primary power delivery network (PDN) structure disposed over the lower semiconductor device tier and the lower signal wiring structure and electrically connected to the lower semiconductor device tier;
   an upper semiconductor device tier disposed over and electrically connected to the primary PDN structure;
   an upper signal wiring structure disposed over the primary PDN structure and electrically connected to the upper semiconductor device tier;
   a secondary PDN structure disposed between the primary PDN structure and the lower semiconductor device tier and the lower signal wiring structure and electrically connecting the primary PDN structure to the lower semiconductor device tier, the secondary PDN structure being narrower than the primary PDN structure; and a through-silicon via (TSV) structure that penetrates the primary PDN structure and the secondary PDN structure and directly electrically connects the lower semiconductor device tier to the upper semiconductor device tier.

2. The multi-tier semiconductor structure of claim 1, wherein the TSV structure includes a plurality of TSVs vertically stacked over one another.

3. The multi-tier semiconductor structure of claim 1, further comprising:
   another lower semiconductor device tier disposed on and electrically connected to the upper signal wiring structure;
   another primary PDN structure disposed over the another lower semiconductor device tier and electrically connected to the another lower semiconductor device tier;
   another upper semiconductor device tier disposed over and electrically connected to the another primary PDN structure; and
   another upper signal wiring structure disposed over the another primary PDN structure and electrically connected to the anther upper semiconductor device tier.

4. The multi-tier semiconductor structure of claim 1, further comprising:
   an upper substrate disposed between the upper semiconductor device tier and the primary PDN structure; and
   an upper power rail buried in the upper substrate, the upper power rail electrically connecting the primary PDN structure to the upper semiconductor device tier.

5. The multi-tier semiconductor structure of claim 1, wherein the upper signal wiring structure is disposed over the upper semiconductor device tier.

6. The multi-tier semiconductor structure of claim 5, wherein the lower semiconductor device tier is disposed over the lower signal wiring structure.

7. The multi-tier semiconductor structure of claim 6, wherein the lower semiconductor device tier and the upper semiconductor device tier are symmetrical with respect to the primary PDN structure.

8. The multi-tier semiconductor structure of claim 1, further comprising a power distribution structure electrically connected to the primary PDN structure, the power distribution structure disposed beyond the upper signal wiring structure and the lower signal wiring structure.

9. The multi-tier semiconductor structure of claim 1, wherein the upper semiconductor device tier includes multiple upper semiconductor devices that are vertically stacked over one another.

10. The multi-tier semiconductor structure of claim 9, wherein the upper semiconductor devices include gate-all-around semiconductor devices that are vertically stacked over one another.

11. The multi-tier semiconductor structure of claim 1, wherein the upper signal wiring structure includes multiple wiring levels.

12. The multi-tier semiconductor structure of claim 1, wherein the primary PDN structure is sized sufficiently to shield the lower semiconductor device tier when executing annealing when forming the upper semiconductor device tier.

13. A multi-tier semiconductor structure, comprising:
   a lower semiconductor device tier;
   a lower signal wiring structure electrically connected to the lower semiconductor device tier;
   a primary power delivery network (PDN) structure disposed over the lower semiconductor device tier and the lower signal wiring structure and electrically connected to the lower semiconductor device tier;
   an upper semiconductor device tier disposed over and electrically connected to the primary PDN structure;
   an upper signal wiring structure disposed over the primary PDN structure and electrically connected to the upper semiconductor device tier; and
   a power distribution structure electrically connected to the primary PDN structure, the power distribution structure disposed beyond the upper signal wiring structure and the lower signal wiring structure,
   wherein the power distribution structure is disposed within a boundary region of the multi-tier semiconductor structure where no semiconductor device tier is disposed, and the primary PDN structure is sized sufficiently to shield the lower semiconductor device tier when executing annealing when forming the upper semiconductor device tier and extends to the boundary region.

14. A method for fabricating a multi-tier semiconductor structure, the method comprising:
   providing a lower semiconductor device tier;
   electrically connecting a lower signal wiring structure to the lower semiconductor device tier;
   disposing a secondary power delivery network (PDN) structure over the lower semiconductor device tier and the lower signal wiring structure;
   electrically connecting the secondary PDN structure to the lower semiconductor device tier;
   disposing a primary PDN structure over the secondary PDN structure, the primary PDN structure being wider than the secondary PDN structure;
   electrically connecting the primary PDN structure to the secondary PDN structure;
   disposing an upper semiconductor device tier and an upper signal wiring structure over the primary PDN structure;
   electrically connecting the upper semiconductor device tier to the upper signal wiring structure;
   electrically connecting the primary PDN structure to the upper semiconductor device tier; and
   forming a through-silicon via (TSV) structure that penetrates the primary PDN structure and the secondary PDN structure and directly electrically connects the lower semiconductor device tier to the upper semiconductor device tier.

15. The method of claim 14, wherein the multi-tier semiconductor structure is fabricated by sequential 3D integration.

16. The method of claim 15, wherein the primary PDN structure is sized sufficiently to shield the lower semiconductor device tier when executing annealing when forming the upper semiconductor device tier.

* * * * *

UNITED STATES PATENT AND TRADEMARK OFFICE
CERTIFICATE OF CORRECTION

PATENT NO. : 12,176,293 B2  
APPLICATION NO. : 17/541561  
DATED : December 24, 2024  
INVENTOR(S) : Liebmann et al.

Page 1 of 1

It is certified that error appears in the above-identified patent and that said Letters Patent is hereby corrected as shown below:

On the Title Page

Column 1, item (72), under "Inventors", Line 1, delete "Mechanicsville," and insert
-- Mechanicville, --, therefor.

Signed and Sealed this
Fifteenth Day of April, 2025

Coke Morgan Stewart
*Acting Director of the United States Patent and Trademark Office*